United States Patent [19]
Buechele et al.

[11] Patent Number: 4,816,754
[45] Date of Patent: Mar. 28, 1989

[54] CONTACTOR AND PROBE ASSEMBLY FOR ELECTRICAL TEST APPARATUS

[75] Inventors: Alvin W. Buechele; Thomas J. Cochran, both of Lagrangeville, N.Y.; Philo B. Hodge, Roxbury, Conn.

[73] Assignee: International Business Machines Corporation, Armonk, N.Y.

[21] Appl. No.: 857,696

[22] Filed: Apr. 29, 1986

[51] Int. Cl.⁴ ............................................. G01R 31/02
[52] U.S. Cl. ................. 324/158 F; 324/73 PC; 324/158 P
[58] Field of Search ........... 324/73 PC, 158 F, 158 P, 324/73 AT

[56] References Cited

U.S. PATENT DOCUMENTS

| | | | |
|---|---|---|---|
| 4,063,172 | 12/1977 | Faure et al. | 324/158 F X |
| 4,290,015 | 9/1981 | Labriola | 324/158 R X |
| 4,321,533 | 3/1982 | Matrone | 324/158 P |
| 4,518,910 | 5/1985 | Hottenrott et al. | 324/158 P X |
| 4,622,514 | 11/1986 | Lewis | 324/158 P X |
| 4,686,464 | 8/1987 | Elsässer et al. | 324/158 P |

Primary Examiner—Reinhard J. Eisenzopf
Assistant Examiner—Vinh P. Nguyen
Attorney, Agent, or Firm—Douglas A. Lashmit; Graham S. Jones, II

[57] ABSTRACT

Substrates are tested by conductive, individually plug replaceable, buckling beam probes in a probe pattern to engage the circuitry on the substrate. When probes engage the substrate, they buckle as a given engaging force is exceeded. Each probe socket is adapted to releasably retain a probe inserted in its socket. The probes and the probe sockets are axially mounted in a probe housing. A probe in a socket has a first end oriented to engage the circuitry and a second end is releasably engaged in a sleeve in its socket. the probe pattern is displayed radially. Guides have guide pins mounted in the probe housing. The pins cooperate with companion guide ways with contours such as slots. The guide ways in the substrate engaging member, and an actuator move the substrate engaging member relative to the guide pins along the contours of the guide ways. Cams are affixed to the probe housing approximately 180 degrees from one another, with a cam follower movably mounted relative to the cams so the cam follower engages the cams, and the follower is driven relative to the cams. The substrate engaging member either shrouds the first ends of the probes, or exposes the first ends of the probes to engage the circuitry.

11 Claims, 5 Drawing Sheets

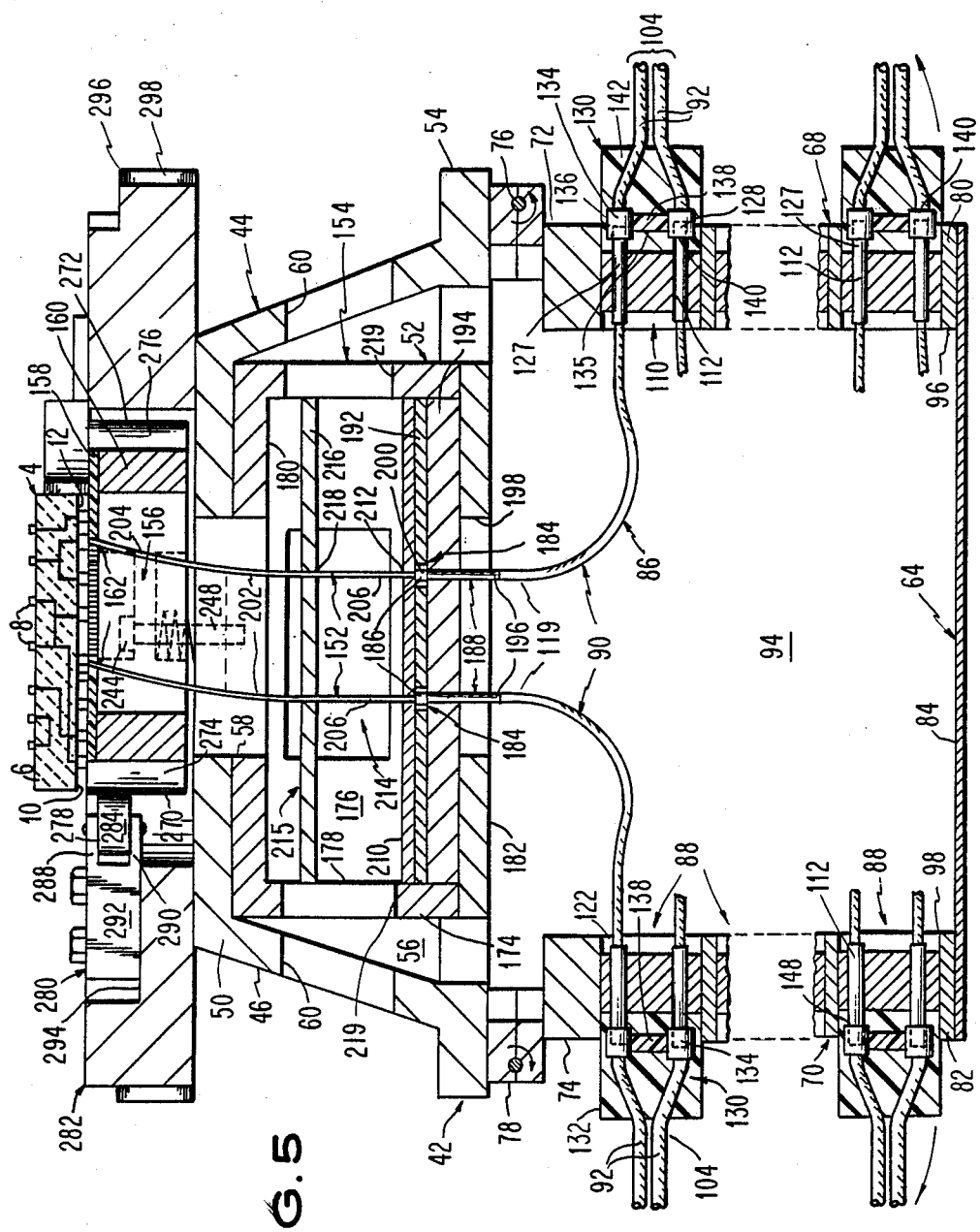

CONTACTOR AND PROBE ASSEMBLY FOR ELECTRICAL TEST APPARATUS

BACKGROUND OF THE INVENTION

1. Field of Invention

This invention relates to electrical testing of chip packaging assemblies and more particularly to buckling beam testing apparatus and methods of using such apparatus.

2. Background Information

Designers of today's computers continually seek to develop products having increased operating speed and reduced size. The desire for more speed in less space has required that larger and larger numbers of electrical circuits be packed into smaller and smaller volumes. The resulting increase in circuit density, however, has given rise to substantial difficulty in testing such assemblies.

To achieve increased circuit density, designers have resorted to techniques that shrink the number and size of the interconnections between circuits, and between the circuits and the outside world. These techniques, referred to generally as Very Large Scale Integration (VLSI), include grouping as many as 100 integrated circuit chips on a multilayer ceramic (MLC) substrate as small as 90 mm square to form densely packed circuit assemblies. The MLC substrate features multiple layers of alternating metalization and ceramic insulation which together make up the interconnections. These interconnections electrically couple the chips and facilitate transmission of input and output signals and power to and from the chips. Use of metal film technology permits the interconnections to be reduced in size and packed closely together. The ceramic insulation between and among metalization layers assures required electrical isolation.

Densely packing the circuits into a single assembly, however, causes both the cost and operating importance of the assembly to increase dramatically. It is, therefore, essential to manufacturing cost efficiency and system reliability that the MLC substrate be thoroughly tested before use. Pre-assembly testing screens out substrates having circuit defects that could render an assembly and its associated chips inoperative.

But, due to the nature of MLC, testing can present substantial problems. Particularly, it becomes difficult to accurately contact the dense MLC metalization patterns, and to test the large number of circuits in commercially acceptable times. Further, contacting problems are aggravated by metalization distortions and substrate height variations that arise during the MLC manufacturing process.

As noted, an MLC metalization pattern, in some cases, can accommodate up to 100 semiconductor chips. As more fully described in U.S. Pat. No. 4,245,273, issued Jan. 13, 1981 to I. Feinberg et al., and assigned to the assignee of this application, the MLC substrate features an upper surface, referred to as the "chip surface", having a dense metalization pattern that includes a multiplicity of chip mounting cites surrounded by engineering change pads (EC pads). Semiconductor chips are electrically and mechanically joined to the substrate at the mounting sites, while selective linking of the EC pads with discrete ribbon segments finalizes the chip interconnect patterns provided in the substrate. Such patterns can have in excess of 12,000 points that require contact for testing.

The lower surface of the MLC, while having far fewer metalization points requiring contact, nonetheless, also features a dense metalization pattern. The lower surface is designed to provide input and output signals and power to and from the chips, and, accordingly, is commonly referred to as the "I/O surface". The I/O surface metalization can have 1,800 or more metalization points which are interconnected by circuits throughout the substrate body with the chip cites and EC pads.

Contacting this profusion of points at the substrate chip and I/O surfaces is made more difficult by distortions that arise in the substrate during its manufacture. In the course of making the MLC, alternating layers of metalization and "green"; i.e., uncured, ceramic are stacked to form the substrate. This structure is subsequently fired at high temperature to cure the ceramic. During the curing process, the ceramic shrinks, nonuniformly, to produce a substrate that is "pillow" shaped; i.e., thicker at the middle than at the sides, and gathered at the corners. This distortion, which varies from substrate to substrate, results from the concentration of metalization at the structure's central region. Where less metal is present; e.g., the substrate sides and corners, the shrinkage is greater.

Because the metalization pattern is dense and nonuniformly distorted, and the substrate height uneven, contacting the substrate for test purposes presents a number of problems. Early test strategy included attempts to minimize the effects of height variations by testing with a few accurately placed probes arranged to span only a small region of the surface at a time. The probes were repeatedly applied to the substrate in a series of steps until the entire pattern was covered. However, excess amounts of time were required to complete this "step and repeat" process, and, as a result, it proved commercially unsuited for the more densely metalized substrates that have evolved. Additionally, the step and repeat process requires allowance for nonuniform distortion that arises over the substrate surface; a requirement that is difficult, at best, to meet.

Alternatively, the process of applying multiple probes configured to embrace the entire substrate metalization pattern in a single step was developed in an effort to speed testing. However, this too is problematic. For example, accurate alignment of multiple probes with an entire surface metalization pattern is difficult, and becomes more complicated where the pattern is nonuniformly and uniquely distorted. Further, variation of probe forces resulting from variations in substrate surface height gives rise to stresses that can fracture the substrate.

Despite the difficulties associated with single application, multi-element contacting, apparatus has been developed for testing complex electrical substrates such as MLC in this fashion. Particularly, U.S. Pat. No. 4,518,910, issued to Hottenrott et al., on May 21, 1985, assigned to the assignee of this application, describes apparatus capable of electrically testing MLC substrates in a single step.

The apparatus disclosed features contactors for electrically coupling the testing means to the substrate chip and I/O surfaces. The contactors each include a probe assembly having a plurality of spatially confined, electrically conductive probes designed to register with the entire metalization pattern of the respective substrate surface. The probes are further designed to accommodate any unevenness in the substrate surface height. Additionally, each contactor includes a probe space transformer comprising a plurality of wire fan-out elements connected to the probes for spatially expanding the probe pattern and electrically coupling the probes to the testing means.

The contactor for the substrate chip surface typically includes a probe assembly having a plurality of so called "buckling beam" probes. The electrically conductive beams have an axial length substantially greater than their cross section, and are arranged perpendicularly to the substrate surface. In this configuration, one end of each probe is fixed in the assembly housing, and the other is free and registered with the point in the metalization to be contacted.

When the probes are brought against the substrate, the engaging force at each increases as a function of substrate height. As the array is pressed against the substrate to insure complete contact, forces at each probe increase until the probe buckles. Once buckled, the probe engaging force remains substantially constant as the probe array is, thereafter, pressed to the substrate. This operation permits the forces applied by the contactor to remain substantially uniform across the substrate, even though the substrate height may vary significantly. A more detailed explanation of buckling beam probes and operation may be found in U.S. Pat. No. 3,806,801, issued Apr. 23, 1974, to R. Bove, and assigned to the assignee of this application.

The contactor for the substrate I/O surface, although not discussed in the noted patents, in the past has been required to use "pogo" probes. To properly test MLC, the substrate must be contacted at its chip and I/O surfaces simultaneously. But, as noted above, the MLC chip surface has many times more points to engage than the I/O surface. As a result, the force applied at the chip surface would be substantially greater than the force applied at the I/O surface if like type probe assemblies were used. Thus, to avoid a substantial imbalance in the applied forces which could lead to fracture of the substrate, it was necessary that the I/O probe assembly exert an engagement force in excess of what a conventional buckling beam assembly would be capable of. As a result, pogo probes, which have a wider range of engaging forces were selected for use at the substrate I/O surface contactor.

Each pogo probe includes an electrically conductive contact plunger that is spring loaded and slidably received in a conductive sleeve Selection of the sleeve spring controls the engaging force characteristic for the probe. The sleeves are fixedly mounted in the assembly housing. In operation, as the contactor is pressed against the substrate, the probe assembly plungers are pushed into their respective sleeves, compressing their associated springs. As the contactor is withdrawn, the respective springs restore the plungers to their original heights.

To electrically couple the spatially confined probes to the testing means, both the chip and the I/O contactors include a space transformer having a plurality of fan-out wire elements. The fan-out elements are simply collected in bundles of conveniently size to form cables which spatially expand and electrically connect the probes to the testing means. Adequate slack is provided in the cabling to permit free movement of the contactors during test.

While these contactors have enabled the MLC to be successfully tested, still a number of problems remain.

Particularly, in operation, the I/O contactor is repeatedly moved to and from the substrate to "sandwich" the substrate between the chip surface contactor and the I/O contactor for test. As a result of this repeated movement, the fan-out wires, especially those of the I/O space transformer, are subject to work hardening and breakage. But, once a fan-out wire breaks, locating it for repair among all the other fan-out wires requires many man-hours. The consequence is that where failure occurs, repair becomes commercially impractical. And, since the fan-out elements are fixed to the probe assembly, it may be necessary to discard the entire contactor and replace it with a new one; i.e., probe assembly and fan-out elements. As can be appreciated, this is costly and, therefore, undesirable.

Additionally, both the buckling beam probes and the pogo probes are also subject to failure. While the buckling beam probes are simpler and more reliable than pogo probes, the buckling beam probes can, nonetheless, experience difficulty. Buckling beam probes are typically small; e.g., 5 mils in diameter, and lightweight. In operation, their substrate engaging ends can become bent and deformed rendering them inoperative or, worse, a source of damage to the substrate. Since the probes are small and fixed in the contactor, their repair or replacement is impractical. Accordingly, replacement of the probe assembly, or some part of it, along with the respective fan-out elements is required. The result is substantial and undesirable replacement costs.

The pogo probes, because of their mechanical complexity, are even more susceptible to failure. Wear and dirt arising from relative movement of the plunger and sleeve can reduce probe conductivity. Further, the spring can cause the plunger to be ejected from the sleeve following test, rendering the probe inoperative. And, failure of the spring can cause the plunger to be impotently depressed within the sleeve, unable to contact the substrate. Again, because the probes are fixed in the contactor, their repair becomes commercially impractical. The result, once more, is undesirable replacement costs.

A further drawback of the pogo contactor is its inability to maintain uniform engaging force when used on substrates of nonuniform height. Spring loading of the plungers causes engaging force to continually increase as the probes are urged against the substrate. Where substrate height is nonuniform, nonuniform probe forces arise that can cause substrate damage.

Additionally, neither the buckling beam probe contactor, nor the pogo contactor include means for moving the probe assembly in the plane of the substrate metalization for alignment purposes. Typically, an adjustment of the relative position between the substrate and probes is effected by moving the substrate. However, such an arrangement does not allow for relative movement of the probe assemblies, and, therefore, prevents independent alignment of the chip surface probe assembly and the I/O probe assembly with the substrate. While probe displacement means have been proposed; for example, in U.S. Pat. No. 4,063,172, issued to Faure et al. and assigned to the assignee of this application, they are manually operated and require a complicated drive mechanism which is unsuited for automatic and simple repositioning of the probes.

A still further problem is that contactor failures not only add equipment replacement costs, but also, increase testing time and expense. Because so many things can go wrong in contacting the MLC; e.g., fan-out element breakage, probe damage resulting in improper probe alignment or inadequate engagement of the metalization, initial indications of MLC defect generated by the testing means must be verified before they can be considered actual. Accordingly, additional test steps, with their associated time and expense, are required to verify that a fault indication is truly due to a substrate defect, and not a contactor failure.

In the past, substrate test methods included verification steps that required successive tests at several testing units. Following a first substrate test at the primary test apparatus, a second test was undertaken at the primary apparatus in which the relative position of the substrate and probe assembly was adjusted. By adjusting relative position, the substrate metalization points in the second test were associated with probe elements different from those the metalization points were associated with in the first test. This adjustment of contact points and associated probe elements permitted identification of at least some of the spurious fault indications attributable to substrate contacting problems.

Where, based on the tests at the primary apparatus, substrate fault indications were considered likely to be valid, the substrate was removed to a secondary apparatus and tested yet again. The secondary test apparatus was equipped with probe assemblies having a few precisely locatable probe elements that could reliably retest the MLC circuits indicated as defective, thereby, eliminating any question of whether the fault indication was attributable to contacting problems If the secondary apparatus also showed the defect, the defect was considered confirmed, and steps taken to compensate it. Accordingly, by identifying and eliminating at least some of the spurious fault indications at the primary apparatus, testing at the secondary apparatus, and with it overall test time and expense, was reduced.

However, since retest of the substrate at the primary test apparatus required rotation of the substrate about an axis of symmetry common to both the substrate chip and I/O metalization patterns, retest could not be carried out were one, or the other, or both patterns were asymmetrical. As a result all fault verification in substrates having asymmetrical metalization patterns were required to be done at the secondary test apparatus. Where the number of defect indications at the primary apparatus is high, however, verification at the secondary apparatus becomes excessively time consuming and expensive. Further, that time and expense is unjustified, from a product standpoint, where fault indications are due to contactor problems, and not substrate defects. Therefore it would be most desirable to improve substrate test methods so that both substrates having symmetrical as well as asymmetrical metalization patterns could be retested at the primary test apparatus.

SUMMARY OF THE INVENTION

Accordingly, it is an object of this invention to provide a contactor for use in testing a substrate containing electrical circuitry, wherein, the contactor is repairable.

It is a further object of this invention to provide a repairable test contactor including a repairable space transformer having a plurality of replaceable wire fan-out segments.

It is a still further object of this invention to provide a repairable test contactor including both a repairable space transformer having repairable wire fan-out segments, and, a repairable probe assembly having replaceable probe elements.

It is yet another object of this invention to provide a repairable test contactor wherein the contactor probe assembly is capable of applying a substantially uniform engaging force to a substrate of nonuniform surface height.

It is yet another object of this invention to provide a repairable test contactor having a repairable buckling beam probe assembly, which is capable of asserting sufficient force when engaging the I/O surface of an MLC substrate to substantially counteract the engaging force applied at the substrate chip surface during substrate test.

It is still a further object of this invention to provide a probe assembly for a contactor suitable for use in testing a substrate containing electrical circuitry, wherein, the probe assembly is repairable and includes plug replaceable probe elements of the buckling beam type, which are also movable in the plane of the substrate surface to permit alignment with the metalization pattern.

Yet additionally, it is an object of this invention to provide an improved method for testing electrical circuitry associated with substrates having either symmetrical or asymmetrical metalization patterns, wherein, the method includes steps for conducting successive tests of the substrate, between which the relative position of the contactor and substrate may be adjusted so that spurious substrate fault indications obtained during the tests can be identified.

Briefly, the invention achieves the noted objects by including a contactor, which in a first preferred embodiment, is provided with a repairable space transformer. The contactor includes a probe assembly having a plurality of probes confined in a spatially limited pattern and a space transformer having a plurality of electrical conduits, at least some of which, in part, include wire segments. The conduits are arranged to spatially expand the probe pattern and electrically couple the probes to the testing means. In accordance with the invention, the space transformer is made repairable by including organizing means in the contactor that collects the space transformer wire segments into a matrix in which the segments can be identified and isolated for repair or replacement.

In preferred form, the wire organizing means includes a plurality of connectors disposed at predetermined locations within the contactor. The connectors are electrically coupled to one or more of the wire segments, and are supported by members that, in part, make up the contactor housing. Additionally, the connectors are mounted in the member such that each wire segment is divided into a first section and a second section. The first section of each segment is compactly disposed within the contactor, extending between the connector and a probe element. The segment second section is disposed outside the contactor, extending from the connector to the testing means.

Also in preferred form, each connector includes a junction means for arranging the wire segments into a submatrix. The junction means includes one or more electrically isolated pins arranged to define the submatrix. Each of the pins may be connected to a wire segment first section. Additionally, the junction means includes, in preferred form, a socket that is electrically coupled to the pins, and a plug which may be received in the socket. The plug is electrically coupled to the wire segments second section for the respective connector and couples the respective wire segment first sections to the second sections when the plug is received in the socket. This organization permits the wire segments to be easily isolated for repair or replacement should they become damaged.

The contactor, in a second preferred embodiment in accordance with this invention, in addition to having a repairable space transformer as described in connection with the contactor first preferred embodiment, also has a repairable probe assembly. Particularly, the contactor probe assembly includes a plurality of probes of the buckling beam type confined in a spatially limited pattern. The probe assembly is made repairable by providing a plurality of sockets in which the probes may be replaceably inserted. If a probe is damaged or broken during substrate testing, it can be replaced by manually extracting it from its socket and inserting a new one. The sockets are electrically coupled to the testing means by space transformer conduits, at least some of which, in part, include wire segments. Wire organizing means in the form of connectors disposed in the contactor at predetermined locations collect the segments into a matrix from which the segments can be identified and isolated for repair or replacement.

In preferred form, the buckling beam probes are axially mounted in a housing with a first probe end oriented to engage the substrate circuitry and a second end releasably engaged in a probe socket. The probe housing includes a substrate engaging member having a plurality of apertures arranged in a spatially limited pattern in which the probe first ends are received to define the probe pattern. The substrate engaging member may be made movable relative to the length of the probes; i.e., axially, so that in a first position, the substrate engaging member shrouds the probe first ends and in a second position exposes the probe first ends so they may engage the substrate circuitry.

In the second preferred embodiment of the contactor, the buckling beam probe assembly, in addition to being axially movable, may also be made movable parallel to the cross section of the probes to permit alignment of the probes with different points in the substrate. Particularly, the buckling beam assembly may be made movable by providing displacement means for shifting the probe apertures of the substrate engaging member relative to the probe cross section.

In preferred form, the displacement means includes an actuator and guide means for controlling the movement of the substrate engaging member, and with it, positioning of the probe pattern. The guide means includes one or more guide pins and companion guide ways having prescribed contours. By means of the actuator, the substrate engaging member in moved relative to the guide pins in accordance with the contour of the guide ways. As the substrate engaging member is displaced, so too is the probe pattern defined by the apertures in the substrate engaging member. The actuator includes a plurality of cams fixedly mounted to the probe housing, a cam follower movable mounted relative to the cams for engaging the cams, and means for driving the cam follower relative to the cams.

In preferred form, the guide ways include two slots located in the substrate engaging member which cooperate with two pins fixedly mounted relative to the substrate engaging member. Also in preferred form, the actuator includes two cams mounted on the probe housing displaced approximately 180 degrees from one another, and the cam follower is mounted for orbital movement relative to the two cams. In this arrangement, the substrate engaging member and companion probe pattern may be reciprocated between a first and a second position for engaging corresponding first and second points in the substrate.

This invention also includes a probe assembly of the buckling beam type, which is repairable, and displaceable relative to the substrate to be tested, for use with any form of space transformer. The probe assembly is substantially the same as the probe assembly described in connection with the contactor second preferred embodiment, and may further have means for controlling the engaging force at which the probes buckle. The control means includes a force control member having a plurality of apertures through which the probes extend, the apertures corresponding to the apertures at the substrate engaging member. The force control member is located in the probe housing at a point along the probe length lying between the substrate engaging member and the probe sockets. The distance from the substrate engaging member to the control member determining the engaging force at which the probes begin to buckle.

This invention, still further, includes an improved method for testing substrates having symmetrical or asymmetrical metalization patterns, the method including steps for identifying substrate fault indications which are spurious. The improved method features steps for positioning a plurality of probes and the substrate circuitry for coupling to one another, followed by steps for coupling the probes to the substrate to form a plurality of first test circuits. The method includes steps for, thereafter, supplying test signals to the first test circuits, and monitoring the test signals applied to identify first test circuits containing faults. Following the identification of faulty first test circuits, the method includes steps for decoupling the probes and substrate, and adjusting their relative position by rotating the substrate about an axis of symmetry associated with the metalization pattern of one substrate surface, and shifting the probes associated with the other substrate surface metalization pattern to correct any probe misalignment at that surface. After adjusting the relative position of the probes and substrate, the method includes steps for recoupling the probes and the substrate to establish a second set of test circuits to which test signals are applied and monitored. Thereafter, second test circuits containing faults are identified and compared with the first test circuits containing faults to identify defect indications which are spurious.

In preferred form, the method includes steps for adjusting the probe and substrate relative position by rotating the substrate 180 degrees about an axis of symmetry associated with the substrate chip surface, and, thereafter, applying a force substantially parallel to the cross section of the probes associated with the substrate I/O surface to correct any misalignment.

The foregoing and other objects, features and advantages of the invention will be appreciated from the following more detailed description of preferred embodiments of the invention as illustrated in the accompanying drawings.

BRIEF DESCRIPTION OF THE DRAWINGS

FIG. 3A is a fragmented section view of a portion of the probe assembly mounting in accordance with this invention, taken along line 3—3 of FIG. 2.

FIG. 5 is a section view, in front elevation, of elements of a contactor, and a substrate in accordance with invention, taken along line 5—5 of FIG. 4.

DESCRIPTION OF PREFERRED EMBODIMENTS

Figure 1:
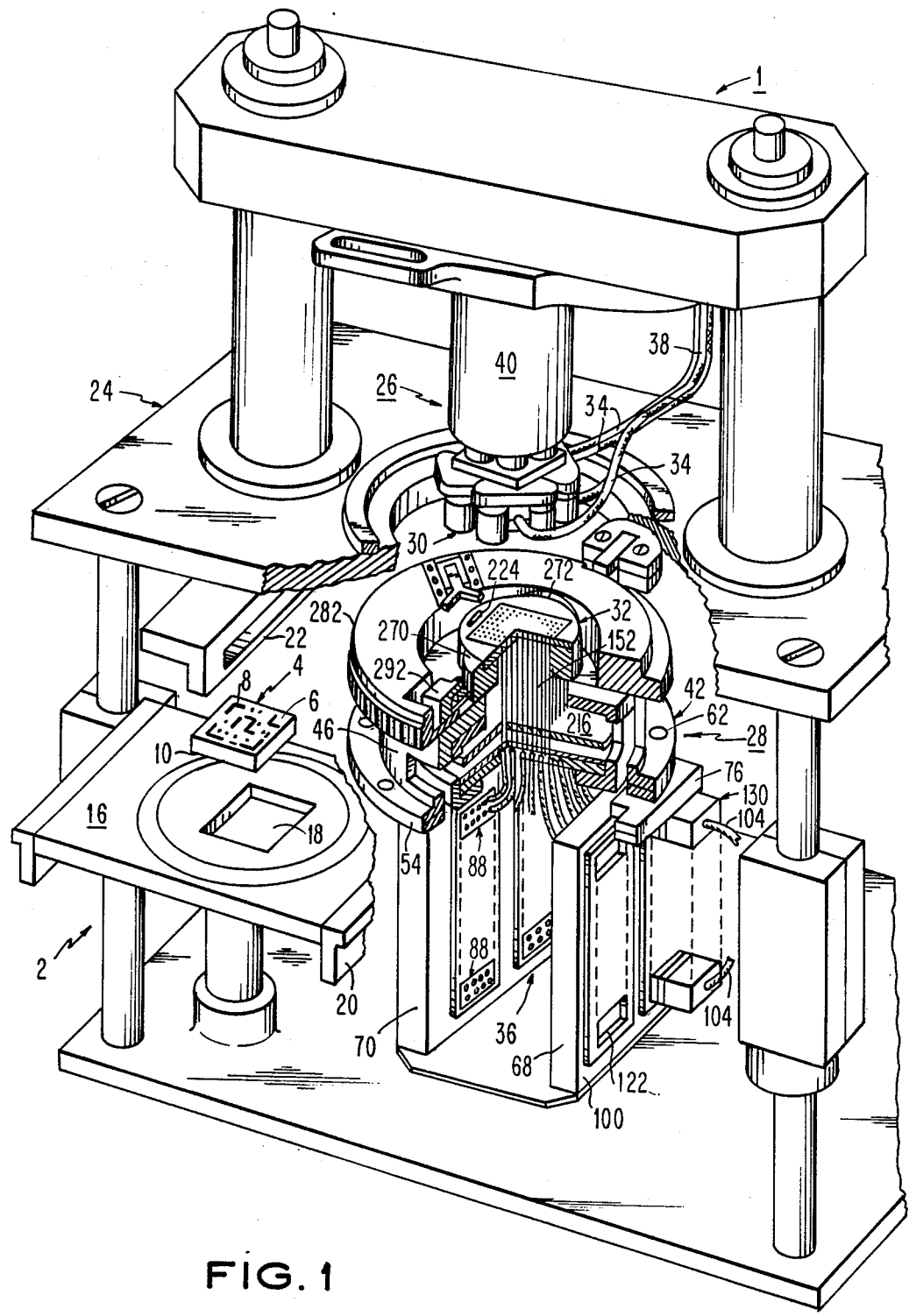
FIG. 1 is a perspective view, partially in section and partially fragmented,. of a testing apparatus having a contactor in accordance with this invention for engaging a substrate for test.

As noted, designers of today's computers pack large numbers of electrical circuits in small volumes to produce products having increased speed and reduced size. The resulting increased circuit density, however, makes electrical testing essential to reliability and cost efficiency of such assemblies difficult and expensive.

To achieve their speed and size objectives, designers have developed multilayer ceramic (MLC) substrates that mount and interconnect as many as 100 integrated circuit chips on as small as a 90 mm square multilayer ceramic slab to form a densely packed circuit assembly. Densey packing so many circuits and chips in one assembly, however, requires the MLC substrate be thoroughly tested before use in order to avoid losses in time, money and, most importantly, operating capacity that would result if the substrate proved to be defective.

But testing MLC, as also noted, presents substantial problems. It is difficult to accurately contact its dense surface metalization, and test its large number of circuits in commercially acceptable times. Additionally, contacting problems are aggravated by distortions in the substrate that arise during MLC manufacture. Particularly, nonuniform distortion of substrate surface metalization pattern and height, both of which vary from substrate to substrate, make it difficult to accurately and quickly contact the circuitry, and to contact it without risk of substrate fracture because of nonuniform engaging forces.

Despite these difficulties, apparatus has been developed which can test MLC substrates in commercially acceptable times. As described by Hottenrott et al. in U.S. Pat. No. 4,518,910 this equipment includes contactors capable of electrically coupling a testing means to the MLC substrate so that all of the MLC circuits can be tested in a single application of the contactors to the substrate. The contactors each include a probe assembly having a plurality of conductive probe elements spatially confined to register with the substrate points to be contacted, and designed to conform with the uneven substrate surface height. Still further, the contactors include a space transformer having a plurality of wire fan-out elements to electrically couple the probes to the testing means.

While these contactors have experienced success, still problems remain. Particularly, they are not readily repairable, thus compelling substantial replacement costs if contactor elements fail. Further, the contactor for engaging the MLC I/0 surface includes pogo probe elements which apply nonuniform engaging forces to the uneven substrate surface, creating the risk of substrate fracture. And, neither the contactor for engaging the substrate chip surface, nor the contactor for engaging the substrate I/O surface includes means for moving the probe assemblies in the plane of the substrate metalization pattern. The probe assemblies, therefore, can not be moved to vary alignment with the substrate or with each other; and any alignment change between the probe and substrate must be accomplished solely by substrate movement. This restricts testing of asymmetrical substrates which will not simultaneously align at both the chip surface contactor and the I/O surface contactor following substrate movement.

This invention overcomes problems of prior art contactors, and particularly, prior art contactors for engaging an MLC I/O surface, by providing a contactor, which in a first preferred embodiment, includes a repairable space transformer having identifiable and isolatable wire fan-out segments. The contactor, in a second preferred embodiment, in addition to having the repairable space transformer of the contactor first preferred embodiment, also may include a repairable probe assembly having plug replaceable probe elements of the buckling beam type suitable for engaging the I/O surface of an MLC substrate, and a movable probe assembly so the probe pattern may be independently aligned with the substrate surface to be contacted.

Test apparatus featuring a contactor in accordance with this invention is shown in FIG. 1. As seen in FIG. 1, test apparatus 1 includes a carriage assembly 2 for receiving an MLC substrate 4 to be tested. Substrate 4 includes an upper surface 6 having a metalization pattern 8 thereon for mounting a plurality of integrated circuit chips, not shown. The upper surface, commonly referred to as the "chip surface", may be capable of mounting as many as 100 integrated circuit chips or more, and have 12,000 or more points to be contacted during test. Substrate 4 also includes a lower surface 10 having a metalization pattern 12 for supplying input and output signals and power to and from the chips. Lower surface 10 and its metalization pattern 12, commonly referred to as the "I/O surface", may include as many as 1,800 or more points requiring contact during test of substrate 4. As best seen in FIG. 5, chip mount metalization pattern 8 and I/O pattern 12 are interconnected by metalization layers throughout substrate 4, which may form on the order of 3,000 MLC circuits that require testing. Further details of MLC construction can be obtained by referring to U.S. Pat. No. 4,245,273, issued to I. Feinberg et al., above noted.

Continuing with reference to FIG. 1, substrate 4 is received in carriage assembly 2 which includes a transport platform 16 and a substrate receiving socket 18. Platform 16 is disposed on rails 20 which are slidably received in guides 22 mounted in apparatus framework 24. In operation, substrate 4 is loaded into socket 18 while platform 16 is outside apparatus 1. For test, a drive means, not shown, under the control of the testing means, draws platform 16 and substrate 4 into the apparatus.

As seen in FIG. 1, apparatus 1 also includes a contactor 26, shown fragmented, for engaging substrate chip mount surface 6 and its metalization pattern 8, and a contactor 28, shown partially in section, for engaging the substrate I/O surface 10 and its metalization pattern 12.

Both contactors 26 and 28 include probe assemblies 30 and 32, respectively, ad probe space transformers 34 and 36, respectively, for electrically coupling the apparatus testing means to substrate 4. The testing means, not shown, includes suitable elements for generating, sensing and analyzing test signals supplied to the substrate in order to determine, among other things, opens and shorts in the substrate circuitry. Additionally, the testing means includes data processing elements for controlling and supporting system operation. These elements are well known in the testing art, and need not be further described here.

Still with reference to FIG. 1, probe assembly 30 of chip surface contactor 26, while shown only fragmented, is of the buckling beam type, and its space transformer 34 includes wire fan-out segments which are collected in cabling 38 that extends to the testing means, not shown. Contactor 26 is mounted on apparatus framework 24, and includes a shock absorber 40 for cushioning contactor 26 when substrate 4 is brought into engagement with it. Details of chip surface contactor 26 can be obtained by referring to U.S. Pat. No. 4,518,910 issued to Hottenrott et al. noted above.

Figure 2:
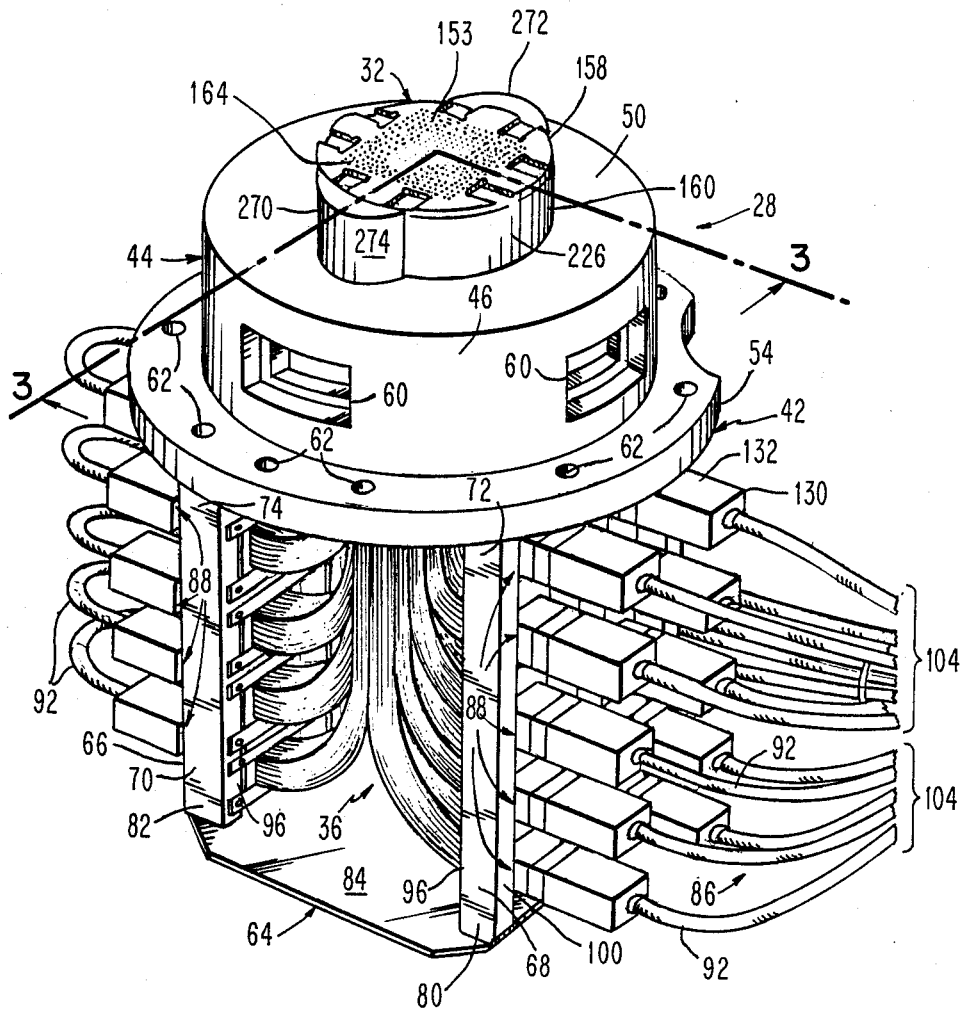
FIG. 2 is a perspective view of a contactor in accordance with this invention.

As shown in FIG. 1, I/O surface contactor 28 in a first preferred embodiment includes a housing 42 for mounting the contactor in apparatus 1, and for supporting probe assembly 32 and space transformer 36. As best seen in FIGS. 2 and 5, housing 42 has an upper section 44 which in preferred form includes tapered cylindrical side wall 46, an upper annular end wall 50 and a lower support flange 54. Flange 54 facilitates mounting of housing 42 to apparatus 1.

As best seen in FIG. 5, end wall 50 and side wall 46 define an internal chamber 56 partially closed at wall 50 and open at flange 54 for receiving probe assembly 32. Probe assembly 32 is mounted on end wall 50 and extends into and out of housing 42 in the direction of the housing's length axis, through a port 58 defined by annular wall 50. Side wall 46 of housing 42 is tapered in the direction of end wall 50 in order to provide space between wall 46 and probe assembly 32. This permits manipulation of probe assembly 32 during construction. Side wall 46 also includes a plurality of ports 60 to facilitate access to probe assembly 32 within chamber 56. In preferred form, four ports of substantially rectangular shape are provided centered approximately 90 degrees from one another around the periphery of wall 46 and at approximately mid-height in the wall. As best seen in FIG. 1, holes 62 are provided in flange 54 suitable for cooperation with bolts and nuts, not shown, to enable removable mounting of contactor 26 in apparatus 1. When mounted in apparatus 1, contactor 28 is axially aligned with contactor 26 and arranged so that it is movable axially toward contactor 26.

Continuing with reference to FIGS. 2 and 5, housing 42 is also formed, in part, by a lower contactor section 64 that is defined by a member 66. In preferred form, member 66 includes two form housing upper section 44. Panels 68 and 70 have upper ends 72 and 74, respectively, which are movably mounted to flange 54 by means of hinges 76 and 78, respectively. Panels 68 and 70 further have lower ends 80 and 82, respectively, which are joined by an end plate 84. In a first position, panels 68 and 70 extend substantially perpendicularly from upper section flange 54, as best seen in FIG. 5. Following removal of end plate 84, panels 68 and 70 are rotatable about hinges 76 and 78, respectively, to a second position which, in the limit, may be displaced approximately 90 degrees from the first. In the limit, panels 68 and 70 extend substantially parallel to flange 54 exposing the interior of housing 42. As will be appreciated by those skilled in the art, the first and second position limit for panels 68 and 70 represent the range of motion, and, accordingly, that intermediate positions within those limits are possible and contemplated.

With reference to FIG. 2, contactor space transformer 36 includes a plurality of electrical conduits 86 extending from probe assembly 32 to the testing means not shown. For contactors of this type, a plurality of probe elements are confined in a spatially limited pattern to align with metalization points on the substrate to be contacted. Since the testing means is large and complex, it must be physically displaced from the probe pattern. Individual conduits 86, electrically coupled to the probe elements, are used to spatially extend the probe pattern, and electrically couple the probes to the displaced testing means. In the past, a number of approaches have been used to formulate conduits 86; e.g., printed circuits, multilayer ceramics, etc. However, a particularly convenient form has been a simple wire segment which extends from the probe elements to the testing means. For convenience, the many wires that make up the space transformer were bundled into one or more cables of suitable size, and lead away to the testing means.

However, conduits formulated as wire segments have experienced repair problems. Due to movement of the contactor, the wire segments are subject to breakage, and, because of their large numbers and physical arrangement in cables, were not readily repairable. More particularly, during test, substrate 4 is transported into apparatus 1 where it is aligned with and between probe assembly 30 and 32 of contactor 26 and 28, respectively. Thereafter, contactor 28 is driven axially upwards in apparatus 1, to compress substrate 4 between probe assembly 30 and 32. Following test, contactor 28 is withdrawn, axially downwardly, releasing substrate 4. This repeated movement of contactors 26 and 28 for successive tests causes the wire segments of space transformer 34 and 36, and particularly those of I/O space transformer 36 due to its substantially greater movement, to work harden and break. Further, and as noted, because of the great number of wire segments required to be collected in the space transformer, it was not possible to identify and locate failed wire segments for repair in a commercially acceptable time. As a result, where wire segments broke, the entire contactor was replaced, at substantial cost.

In accordance with this invention, noted prior art problems of space transformer wire repair are overcome by providing means in the contactor for organizing the wire segments into a matrix from which they may be identified and isolated. As shown in FIG. 2, the wire organizing means of contactor 28, in preferred form, includes a plurality of connectors 88 which are disposed at prescribed locations on panels 68 and 70 for coupling to the space transformer conduit segments 86. Arranging connectors 88 at prescribed locations organizes the conduit segments into a matrix defined by the physical location of the connector with which the respective segments are associated. This permits failed conduit segments to be identified and isolated by the connector location. Additionally, the structure of connectors 88, as will be explained, further simplifies conduit segment location and repair. As will be appreciated, any convenient matrix pattern may be used. In the preferred form shown, the matrix is an array of columns and rows; particularly, two columns of five rows on each of two panels, 68 and 70. The panels act as supports for connectors 88 in this arrangement.

With reference to FIG. 5, connectors 88 are coupled to the conduit wire segments such that each segment is divided into a first section 90 and a second section 92. As seen in FIG. 5, where for clarity only two connectors are shown, segment sections 90 are disposed within the contactor in a contactor interior space 94. Space 94 is bounded by interior surface 96 and 98 of panels 68 and 70, respectively, when the panels are in their first positions. First wire sections 90 extend between their respective probes and connectors. As a result, in accordance with the invention, the geometrical pattern of probe assembly 32 is spatially transformed, in a first stage, to a matrix, which, in preferred form, includes columns and rows at panels 68 and 70.

Continuing with reference to FIGS. 2 and 5, conduit segment sections 92 are organized at exterior surfaces 100 and 102 of panels 68 and 70, respectively. Second sections 92 associated with each connector 88 are collected in cables 104 which subsequently lead to the testing means so as to complete the space transformation of the probe pattern in a second stage. This arrangement confines wire failures to sections conveniently arranged externally to the contactor; only second wire sections 92 experience movement relative to the contactor which can cause breakage.

Since the connectors are alike, their features can be understood with reference to one. As best seen in FIG. 5, top most connector 88 on panel 68 includes a housing 106 that is received in a mounting port 108. Connector mounting port 108 extends through panel 68 from panel interior surface 96 to exterior surface 100. As a result, connector 88 is accessible to the contactor interior and exterior. In accordance with the invention, the physical location of connector 88 at the first column, first row of first panel 68 defines a matrix address for conduits 86 associated with the connector. The address enables quick identification of the conduit wire segments, and their segregation at the connectors provides isolation in the event the segments need to be repaired.

Figure 3:
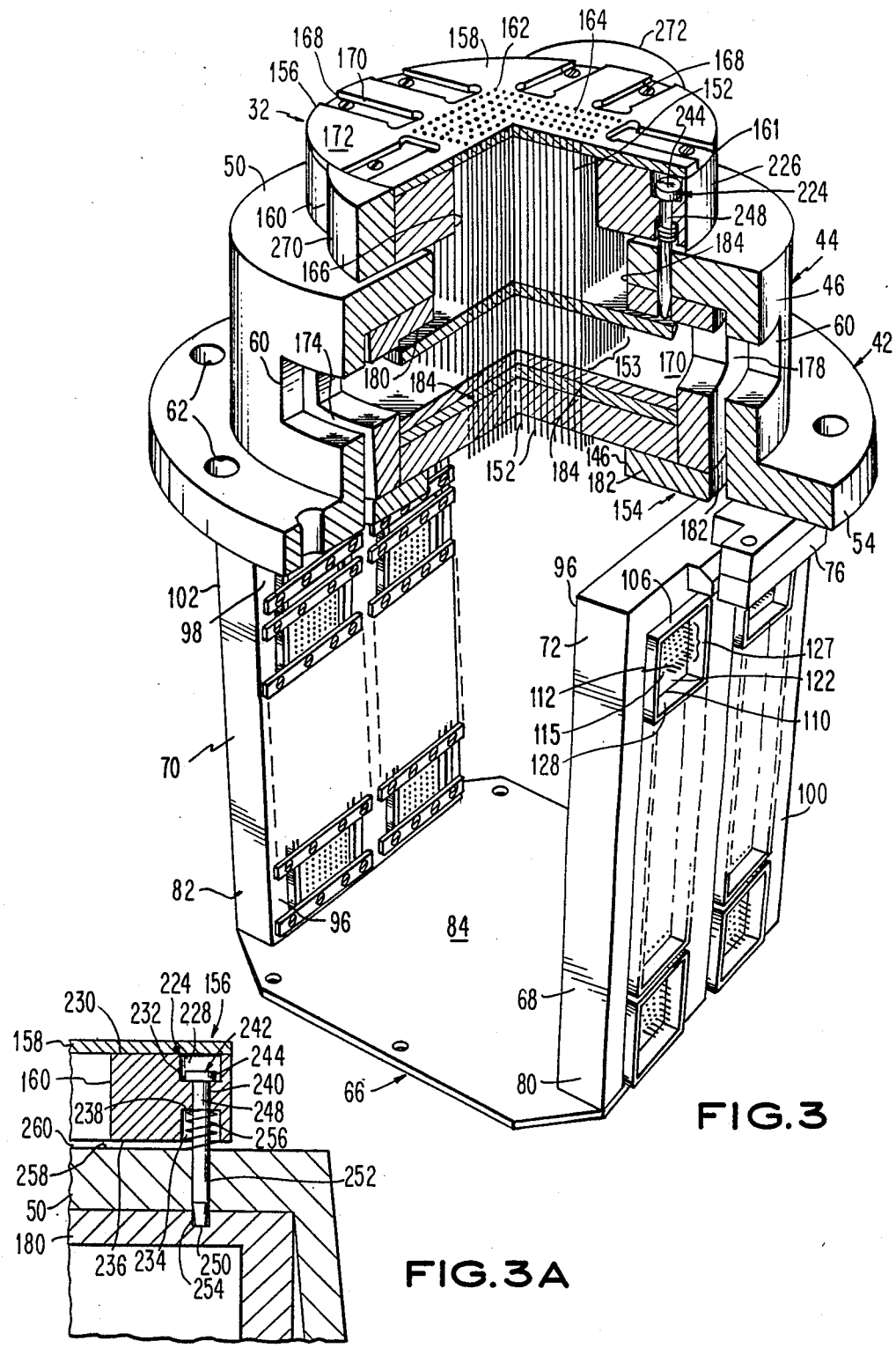
FIG. 3 is a perspective view, partially in section, of elements of a contactor in accordance with this invention taken along line 3—3 of FIG. 2.

Also in accordance with the invention, connector 88 further includes a junction means 110 for organizing conduits 86 and their associated segment first sections 90 and second sections 92 into submatrices, respectively, at panel interior surface 96 and exterior surface 100. This further simplifies segment identification and isolation. In preferred form, and as shown in FIGS. 3 and 5, the submatrices for conduit first sections 90 and second sections 92 are rectangular, each having one or more columns and rows. The submatrices for first sections 90 and second sections 92 are the same so they may be conveniently coupled as further described below. The physical location of sections 90 and 92 in the arrays defines a submatrix address that enables convenient identification and isolation of the conduit segment sections. As will be appreciated, any geometrical pattern capable of indexing the individual conduit sections can be used.

Continuing with reference to FIG. 5, junction means 110, in preferred form, includes a plurality of electrically conductive pins 112. Pins 112 are mounted in a block 116 of insulating material; as for example, phenolic resin or the like, disposed in connector 88. Insulating block 116 electrically isolates pins 112 from one another, and permits their mounting in close proximity. Pins 112 are received in bore holes 114 that extend through block 116 and connector 88. Bore holes 114 orient pins 112 substantially perpendicularly to the cross section of block 116 and contactor housing 106. As best seen in FIG. 3, bore holes 114 collectively establish a pin pattern 115 which defines the submatrix for conduit segment first sections 90. With reference to FIG. 5, each first wire section 90 is electrically coupled to a pin 112. The physical location of each pin, therefore, defines a submatrix address for the respective first sections.

Specifically, and as shown in FIG. 5, pins 112 have ends 118 which extend from block 116 into contactor interior space 94 where they may be individually coupled electrically to ends 120 of wire segment first sections 90 located proximate panel interior surface 96. Coupling may be made in any convenient manner; e.g., by mechanical connection such as soldering. As noted, in preferred form, the submatrix, and accordingly pin pattern 115, is a rectangular array of one or more columns and rows.

With reference to FIG. 3, junction means 110 also includes a socket 122 provided at panel exterior surface 100. Socket 122 has side walls 124 formed by the interior surfaces of connector housing 106, and a back plate 126 formed by insulating block 116 which is recessed in housing 106. Side walls 124 and back plate 126 together form a socket cavity 128. Pins 112 have ends 127 which extend from back plate 126 into cavity 128 to electrically couple pins 112 to socket 122. Pin pattern 115 in block 116 defines a submatrix which, as noted, is rectangular, for spatially organizing pins 112 at socket 122 in one or more columns and rows. As will be appreciated, while in preferred form junction means 110 uses pins, other electrical elements capable of bridging the interior and exterior regions of contactor 28 could be used.

With reference to FIG. 5, junction means 110 further includes a plug 130 which is arranged to be received in socket 122. Plug 130 provides a convenient means for separating ailed wire segments, once identified, from contactor 28. Plug 130 includes a housing 132 conformed to fit within side walls 124 of socket 122 so that plug 130 may be received in cavity 128. Additionally, plug 130 includes a plurality of electrically conductive receptors 134. Receptors 134 are mounted in a block 138 of insulating material; as for example, phenolic resin or the like, disposed in housing 132. Insulating block 138 electrically isolates receptors 134, and permits their mounting in close proximity. Receptors 134 are received in bore holes 136 that extend through block 138. Bore holes 136 orient receptors 134 substantially perpendicularly to the cross section or block 138 and plug housing 132. Collectively, bore holes 136 establish a receptor pattern 135 which defines the submatrix for conduit segment second sections 92. Each second section 92 is electrically coupled to a receptor 134 having a physical location which defines a submatrix address for a respective second section 92.

Receptors 134 have ends 140 which extend from rear face 135 of block 138 into a rear cavity 142 in plug housing 132. Receptor ends 140 extend into cavity 142 such that they may be individually coupled electrically to ends 144 of wire segments 92. Conduit segment second section ends 144 associated with connector 88 are collected in cavity 142 through an access port 146 in the rear of plug housing 132. Coupling may be made in any convenient manner; e.g., by mechanical connection such as soldering.

Receptors 134 also have ends 148 which extend from insulating block front face 150. In accordance with the invention, receptor pattern 135 orients receptor ends 148 to align with pin ends 127 which are arranged in pattern 125 at block 116. Further, receptor ends 148 are configured to accept pin ends 128, and electrically couple receptors 134 and pins 112 when plug 130 is inserted in socket 122. Accordingly, conduit first sections 90 may be interruptably coupled to second sections 92, and probe elements interruptably coupled to the testing means.

As will be appreciated by those skilled in the art, while in preferred form, the pins are located in the sockets and the receptors in the plugs, the respective locations could be reversed. Further, as will also be appreciated, while for simplicity and convenience, pins and receptors have been selected as the elements for establishing interruptable coupling of conduit segment first sections 90 and second sections 92, other means capable of interruptably bridging the contactor interior and exterior could be used.

With this arrangement, and in accordance with the invention, failed space transformer conduits 86 may be quickly and inexpensively repaired. Since conduit first sections 90 are fixedly mounted within the contactor, they are not subject to work hardening. Any conduit failure attributable to contactor movement will be confined to the conduit second sections 92, which are conveniently located externally to contactor 28. A failed conduit second section 92 identified during test may be easily traced by use of the conduit matrix address. Once the failed conduit section is located, the appropriate connector plug and associated cable may be unplugged from contactor 28. Cable 104 may thereafter be opened, and the particular failed conduit section further traced for repair by use of the conduit submatrix address. In the alternative, the entire plug and cable assembly may simply be replaced with a new one.

As will also be appreciated, while all conduits 88 shown in the preferred embodiment include wire segments arranged to be repairable, it would be possible to design space transformer 36 so that only some of the conduits include repairable wire segments. In such case, the connectors would be associated with the conduits as desired. Further, while the first preferred embodiment of contactor 28 is shown including a buckling beam probe assembly 32, to be described hereafter, as will be appreciated, other types of probe assemblies could also be used.

As noted, in the past, I/O contactors included a probe assembly featuring pogo type probes. Despite drawbacks, pogo probes were used because they were capable of generating sufficient engaging force per probe to enable the I/O contactor to counteract the engaging force generated by the chip surface contactor. While it is desirable to set the I/O contactor engaging force somewhat less that the chip surface contactor in order to produce a resultant force that will maintain the substrate in place; e.g. 250 to 300 pounds for a 90 mm, 100 chip MLC, it is undesirable for that force differential to increase to a point at which the substrate is subject to damage. The chip surface contactor, as explained, engages many times more points on the substrate than the I/O contactor, as many as 6 to 7 times more. Accordingly, in order to avoid a force differential that could damage the substrate, the engaging force per probe produced by the I/O probes must be substantially greater than the engaging force produced by each of the chip surface probes. Pogo probes were capable of producing such forces, while conventional buckling beam probes were not.

Pogo probes, however, are undesirable because of the reliability and performance problems they exhibit. Due to the complexity of pogo construction; e.g., a movable contact plunger retained in a sleeve having a restoring spring, pogo probes are subject to diminished conductivity in the presence of wear and dirt, and failure resulting from breakage of their plunger retainers or restoring springs. Additionally, pogo probes, unlike buckling beam probes, produce engaging forces which depend on substrate height. The more a pogo contactor is depressed; e.g., at a substrate high spot, the greater the applied probe force. Thus, where the substrate height is uneven, a pogo probe array produces nonuniform engaging forces across the substrate which can lead to substrate fracture.

A further probe problem, and one that affects both pogo and buckling beam probes alike, is that past probes were designed to be fixedly mounted in the probe assembly. As a result, if a probe element failed; e.g., a dirty, worn or broken pogo, or a bent or deformed buckling, the only repair solution was to disassemble the entire contactor in an effort to repair or replace the damaged probe. But, because of the time required, disassembly is commercially unrealistic, and the common solution is replacement of the entire assembly with the attendant undesirable cost.

This invention solves the noted probe problems in a second preferred embodiment of contactor 28. In the second preferred embodiment, in addition to the repairable space transformer 36 described in connection with the contactor first preferred embodiment, the contactor of the second preferred embodiment includes a buckling beam assembly that is repairable and able to generate sufficient engaging force per probe element to replace the pogo probes used in the past at the I/O contactor.

As seen in FIG. 3, I/O contactor 28 includes a probe assembly 32 having a plurality of electrically conductive probes 152 of the buckling beam type collected in a spatially limited array 153 mounted in a housing 154. Housing 154 includes a substrate engaging member 156 having a substrate engaging plate 158 mounted on a support 160. Plate 158 includes a plurality of apertures 162 arranged to receive probes 152. Apertures 162 collectively define a pattern 164 which corresponds to the pattern of points on substrate I/O metalization 12 to be contacted, and establish spatially limited probe pattern 164. In preferred form, plate 158 is circular, with pattern 164 centered in the plate, As will be appreciated, apertures 162 may be arranged in what ever pattern is required to contact the points of substrate surface metalization 12 to be engaged. As shown, pattern 164 and array 153 are square in preferred form.

Continuing with reference to FIG. 3, plate support 160 includes a passageway 166 to permit access of probes 152 to plate 158 and apertures 162. In preferred form, support 160 is an annular element axially aligned with circular plate 158. Plate 158 is mounted on support 160 at support end 161; as for example, by screws, or the like, 168 received in recesses 170 to maintain surface 172 or plate 158 free of obstructions.

Additionally, housing 154 includes a base 174 having an internal chamber 176 within which probes 152 are mounted. In preferred form, base 174 is cylindrical, having a cylindrical side wall 178, an upper annular end wall 180 and a lower annular end plate 182. Probes 152 are axially mounted in base chamber 176; i.e., the length axis of the probes substantially aligned with the length axis of base 174. Probes 152 extend through a port 184 defined by base annular end wall 180, and continue through passage way 166 on support 160 to plate 158 and apertures 162.

In accordance with this invention, probes 152 are of the buckling beam type. As described in U.S. Pat. No. 3,806,801 issued to R. Bove, and assigned to the assignee of this application, such probes have a length substantially greater than the dimension that characterizes the probe cross section. As a result, when the probes are axially loaded; e.g., when pressed against a substrate, they begin to buckle once a critical engaging force is exceeded. Thereafter, the probe engaging force remains substantially constant as the probe is further pressed to the substrate.

This operation enables an array of such probes to assert a substantially uniform engaging force across its pattern when applied to a substrate of nonuniform surface height; e.g., MLC. Accordingly, by employing buckling beam probes, array 153 is able to apply substantially uniform force to substrate I/O surface 10, and thus avoid one of the principal shortcomings of pogo type probes. However, in order to use buckling beam probes at I/O contactor 28, it was necessary to consider sizes far larger than any known to date. Since the chip surface contactor may be required to engage many times more points during test than the I/O contactor, the I/O probes, as noted, are required to produce substantially more engaging force per probe in order to avoid a force imbalance that could lead to substrate damage. Therefore, while the buckling beam probes used at chip surface contactor 26 are wire sections of approximately 5 mil diameter and 500 mil lengths, capable of producing approximately 35 grams of engaging force per probe, buckling beam probes 152 used at I/O contactor 28 in accordance with this invention are, in preferred form, wire sections of approximately 18 mil diameter and 3,750 mil lengths, capable of generating 150 grams of engaging force per probe. This form factor was selected in an effort to assure adequate engaging force per probe, while at the same time maintaining a probe diameter small enough to provide required contact resolution, and a probe length long enough to sustain buckling action.

Beyond size, however, probes 152 are similar to previously known buckling beam probes. They are made form such materials as alloys of: beryllium-nickel; beryllium-copper; tungsten; or "PALINEY", a palladium-silver based probe material available from J. M. Ney Company, Bloomfield, Conn., or the like. Additionally, probes 152 are coated with an electrically insulating material to assure electrical isolation; e.g., parylene, or the like, which may be vacuum deposited on the probes in accordance with known methods.

To solve the problem of probe repair, in accordance with this invention, probe assembly 32, as shown in FIG. 5, includes a plurality of sockets 184 mounted in base 174 to enable plug replaceability of probes 152.

Each socket 184 includes a sleeve 186 in which a plurality of wire filaments, not shown, are angularly strung. The filaments are arranged in a twisted loom that extends down the length of sleeve 186 at the sleeve inner periphery. When a probe 152 is inserted into a sleeve 186, the filaments stretch and wrap around the probe, retaining it in place. The twisted wire filaments offer minimal insertion resistance, and permit the probes to be manually loaded with a low force. Complete encirclement by the wire filaments securely holds probe 152 in socket 186, while permitting the probe to be manually withdrawn with a low extraction force. This arrangement facilitates manual loading and unloading of probes 152, and permits them to be releasably retained in sockets 184, thus establishing plug replaceability.

Continuing with reference to FIG. 5, each socket 184 further includes a terminal post 188 which extends from the base of sleeve 186 as shown. Posts 188 permit sockets 184 to be electrically coupled to first sections 90 of space transformer conduits 86. Post ends 196, in preferred form, may be coupled to conduit first section ends 119 in any convenient manner; e.g., by mechanical connection such as soldering. Sockets 184 are commercially available from Hypertronics, Inc. of Hudson, Mass., under the trade name "HYPERTAC".

As seen in FIG. 5, sockets 184 are axially mounted in the lower section of housing 174. Sockets 184 are arranged in pattern 190 that corresponds to aperture pattern 164 of substrate engaging member 156, and the pattern at metalization 12 to be contacted. Socket sleeves 186 are received in support members 192, and wiring posts 188 in support member 194. Sleeves 186 and posts 188 are oriented substantially perpendicularly to the cross section of support 192, 194, respectively, and probe housing 174 as shown. Socket post ends 196 extend from support 194 into a port 198 defined by base annular plate 182. Socket sleeve receiving ends 200 are disposed toward base cavity 176.

In preferred form, each probe 152 is a wire length having a shaft section 202 that extends from a first end 204 to a second end 206. Probes 152 are axially oriented in housing 154 with first ends 204 received in apertures 162 of substrate engaging member 156, and second ends 206 in socket sleeves 186. Housing base 174 further includes a plate 210 having a plurality of apertures 212 arranged in a pattern 214 which corresponds to socket pattern 190 and aperture pattern 164 of engaging member 156. In preferred form, each aperture 212, while larger in diameter than probe shaft 202 received therein, is smaller than the outside diameter of socket sleeves 186, and thus plate 210 retains sockets 184 in plate 192. As will be appreciated, other means could also be used to retain sockets in support 192; e.g., press fit, screw thread at sleeve 186, etc.

Additionally, and if desired, aperture pattern 214 may be radially offset relative to socket pattern 190 to pitch probe shafts 202 relative to the housing length axis. As is will known in the art, the offset establishes a preference for the direction probes 152 will buckle in. As is also known, aperture pattern 164 of substrate engaging member 156 may, in addition, be radially offset relative to probe socket pattern 190 to contribute to probe proclivity to buckle in a preferred direction.

Arranging probes 152 to be plug replaceable adds to the range of use probe assembly 32 and its contactor 28 may be put to. Where probes 152 are removable, not only can array 153 be readily repaired, but also, it may be easily modified for use in substrates having different contact patterns. Particularly, probe assembly 32, in addition to being used on substrates having contact patterns corresponding to aperture pattern 164 of plate 158, may also be used to engage substrates having fewer contact points. Probe array 153 can be readily adapted for use with a substrate having fewer contact points by simply unplugging and removing unnecessary probes.

To reconstitute array 153, all that need be done is to reinsert the previously removed probes.

To further add to the versatility of probe assembly 32, in accordance with this invention, assembly 32 may included means for controlling; i.e., varying, the engaging force at which probes 152 begin to buckle. Where it is necessary to vary the number of probes, but, where the engaging force for array 153 is to remain the same; or where the number of probes 152 is to remain the same, but, the total engaging force for the array is required to be changed, undesired probe assembly replacement can be avoided if assembly 32 includes means for varying the engaging force at which each probe buckles. As shown in FIG. 5, assembly 32 includes such means in the form of a control member 215. In preferred form, member 215 includes a plate 216 having a plurality of apertures 218 arranged in a pattern 220. Pattern 220 corresponds to substrate engaging member aperture pattern 164 and probe socket pattern 190. Probes 152 pass through apertures 218 in slide-fit relation, and plate 216 is mounted in housing base 174 at a point along the length of probes 152 between substrate engaging plate 158 and probe sockets 184.

The point of location of plate 216 determines the engaging force at which beams 152 buckle. As will be appreciated by those skilled in the art, the distance from substrate engaging plate 158 to plate 216 defines the active length of probes 152, and, therefore, the beam buckling force in accordance with the well known equation:

$$F = (3\pi)^2 \times E \times I/L^2$$

where, F is the force at which the probe buckles; E is the modulus of elasticity of the probe material; I is the moment of inertia of the probe; and L is the probe length.

Plate 216 is mounted approximately perpendicularly to the length axis of base 174, at a point between the substrate engaging plate 158 and sockets 184 selected in accordance with the above equation to yield the desired engaging force; the distance for substrate engaging plate 158 to the point corresponding to "L" in the equation. In preferred form, member 215 additionally includes means, not shown, for varying the mounting point of plate 216. Particularly, these means may include spacer blocks or mounting notches at wall 178 of base 174, adjusting screws, or the like.

As will be appreciated, probes 152 are intended to be electrically isolated from one another. Accordingly, and even though coated with an insulating materials, all members through which probes 152 pass are made of insulating material; e.g., epoxy glass, or the like. Additionally, the supports in which probe sockets 164 are mounted are also made of insulating material, again epoxy glass, or the like.

To facilitate mounting of members 194, 192, 210 and 216, base plate 182 is made removable to permit access to base chamber 176 in preferred form. A spacer ring 223 may be mounted between the bottom of base side wall 178 and plate 182 to locate probe ends 204 at the desired point in substrate engaging plate 158. Still further, in preferred form, base side wall 178 includes a plurality of; e.g., four, access ports 219 of substantially rectangular shape centered approximately 90 degrees from one another around the perimeter of wall 178 at about mid-height in the wall.

Probe housing 154 is mounted on contactor housing upper section 44, and forms part of overall contactor housing 42. As seen in FIG. 5, probe housing 154 is mounted coaxially with contactor housing section 44 at end wall 50. Substrate engaging member 156 extends axially outwardly from wall 50, and probe housing base 174 extends axially inwardly from wall 50 into contactor chamber 56. As shown, substrate engaging member 156 and base 174 are mounted in axial alignment. Further, in preferred form, access ports 219 of probe assembly 32 align with ports 60 of contactor upper section 44 to facilitate easy access to probes 152 from outside contactor housing 42.

As noted, probes 152 have a small diameter, and are subject to being damaged; e.g., bending, etc., particularly at ends 204 which engage substrate 4. Where probe ends 204 become deformed, not only are they likely to misalign with the points they are to contact, but also, they become a source of injury; e.g., scratching, to the substrate metalization. Therefore, even though probes 152 are readily replaceable, it would be desirable to limit the likelihood of damage to probe ends 204 in order to reduce possible misalignment and risk of damage to the substrate metalization.

To protect probe ends 204, in preferred form, substrate engaging member 156 is movable mounted relative to the length of probes 152, which is also the axial direction of the probe housing 154. In a first position, substrate engaging plate 158 shrouds probe ends 204, and in a second position plate 158 exposes probe ends 204 for engaging substrate 4.

This operation is facilitated by resiliently mounting member 156 such that when assembly 32 is not in engagement with substrate 4, the resilient mounting maintains upper surface 222 of plate 158 beyond probe ends 204, probe ends 204 lying recessed in apertures 162; and when probe assembly 32 is pressed against substrate 4, as seen in FIG. 5, substrate engaging plate 158 is driven back along the length of probes 152; i.e., axially relative to base 174, to expose ends 204 for engaging substrate 4.

Figure 4:
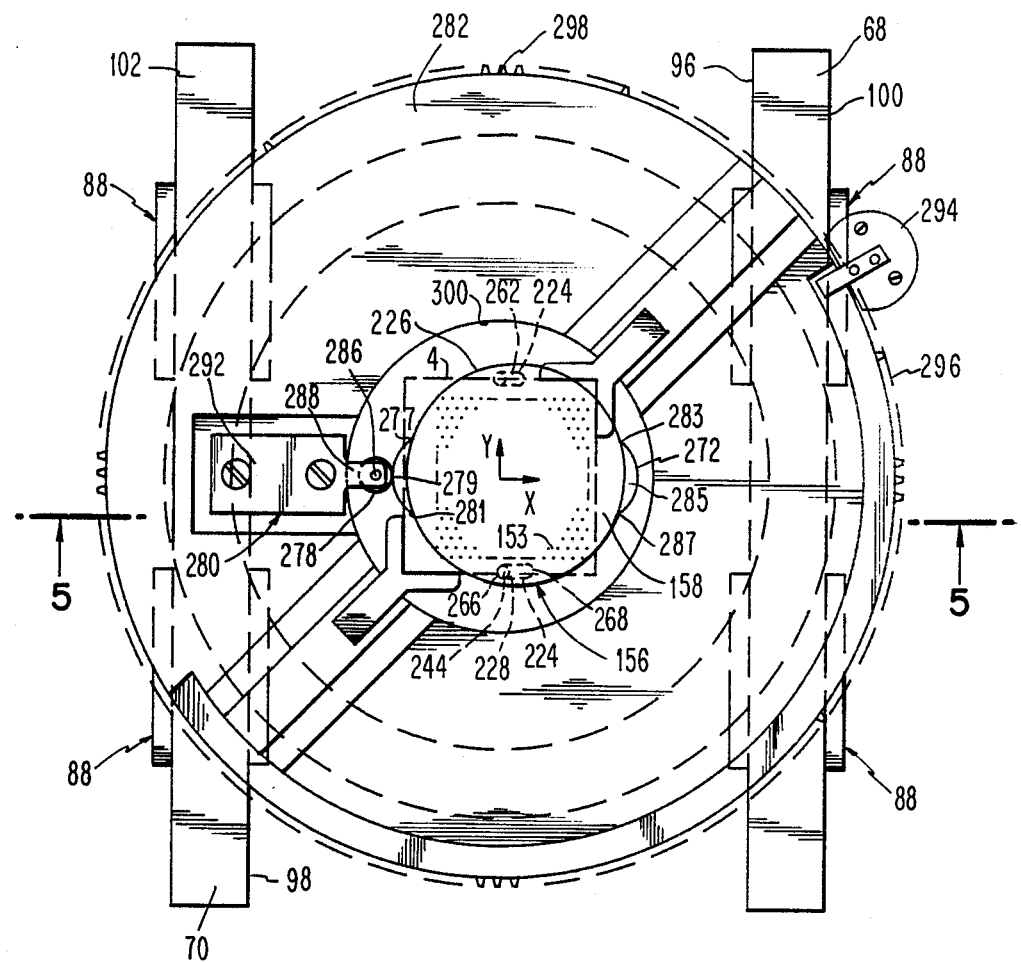
FIG. 4 is a plan view of elements of a contactor and a substrate in accordance with this invention.

In preferred form, the means for resiliently mounting member 156 includes a pair of guide ways disposed in substrate engaging plate support 160. As seen in FIG. 4, guide ways 224 are located diametrically opposed to one another, proximate side wall 226 of support 160. Guide ways 224 are alike, and can be understood with reference to the one shown in FIG. 3A. As seen in FIG. 3A, guide way 224 extends through support 160 and is oriented approximately perpendicularly to its cross section. Guide way 224 includes a first cavity 228 extending from support upper face 230 a distance into support 160 to a shoulder 232, and a second cavity 234, extending from lower face 236 a distance into support 160, to a shoulder 238. Cavities 228 and 234 are joined by a passageway 240.

The resilient mounting means further includes pins 242, each received in a guide way 224. Like guide ways 224, pins 242 are alike and can be understood by referring to the one seen in FIG. 3A. As shown, pin 242 has a head 244 at end 246, and a shaft 248 that extends from head 244 to pin end 250. Pin 242 is slidably received in guide way 224 with pin head 244 abutting guide way shoulder 232 when assembly 32 is not engaging a substrate. Pin 242 extends through support 160, and a passageway 252 in contactor housing upper wall 50, into a bore 254 in end wall 180 of probe housing base 174. Pin end 250 is fixed in bore 254 in any convenient manner; e.g., press fit.

Still further, the resilient mounting means for member 156 includes restoring springs 256 mounted on pin shafts 248 and compressed between the outer surface 258 of contactor wall 50 and shoulders 238 in cavities 234. A shown in FIG. 3A, spring 256 urges guide way shoulder 232, and support 160 against pin head 244 which acts as a stop to outward axial movement of member 156. Pin head 244 is axially spaced sufficiently from probe sockets 184 to assure probe ends 204 are recessed within apertures 162 when probe assembly 32 is not engaging a substrate 32. Further, the height of support 160 and plate 158 are selected relative to the length of pin shaft 248 to establish a gap 260 between the lower face 236 and outer surface 258 of wall 50 of sufficient size so that when plate 158 engages substrate 4, member 156 is driven toward wall 50 and probe ends 204 are exposed at apertures 162 to engage the substrate surface as seen in FIG. 5. The distance from the top of pin head 244 to the underside 261 of plate 158 defines the axial travel of member 156, plate underside 261 acting as a stop. With this arrangement, and as will be appreciated, pin 242 and guide way 224 cooperate to constrain movement of member 156 in the axial direction of the probe housing.

As a further improvement of prior art probe assemblies, I/O probe assembly 32, in accordance with this invention, is movable in the plane of substrate I/O surface 10; i.e., radially relative to probe housing base 174, to permit independent alignment of probe array pattern 153 with substrate metalization pattern 12.

Neither chip surface probe assembly 30, nor I/O surface probe assembly 32 in the past were independently alignable with their respective substrate surfaces 6, 10. Alignment between substrate surface 6, 10 and their respective probe assemblies was accomplished by movement of the substrate alone. However, alignment by substrate movement alone causes attempted alignment at one probe assembly to affect alignment at the other. Further, since the probe assemblies are not capable of relative movement, it prevents any chance of correcting misalignment by movement of the misaligned probe assembly. This limitation is particularly significant where the chip surface metalization pattern and the I/O surface metalization do not have a common axis of symmetry. In such cases, attempts to verify test results which include substrate movement, as will be described hereafter, can not be carried out.

To overcome this problem, I/O surface probe assembly 32 includes a displacement means for moving probe apertures 162 of substrate engaging plate 158 to displace probe array 153 in the plane of substrate I/O surface 10.

With reference to FIGS. 3A and 4, the displacement means includes guide ways 224 and pins 244, described above, which together, constitute a guide means for constraining movement of substrate engaging member 156 radially relative to probe housing base 174. In order to enable radial movement of member 56, guide way cavities 228, 234 and passageway 240, are configured as slots which extend in a line substantially parallel to an axis in the plane of probe array 153; e.g., "X" axis shown in FIG. 4. Pins 242, which as noted, are fixed in end wall 180 of probe housing base 174 have heads 244 that cooperate with the contour of cavities 228; e.g., slot side walls 262, 264, to direct movement of engaging plate 158 and apertures 152. Pin heads 244 cooperate with cavity end walls 266, 268 to define stops, while the length of side wall 262, 264 extending between the end walls establish the range of motion of substrate engaging member 156. As will be appreciated, pin shaft 248 and passageway 240 may be arranged to assist in, or in the alternative, control movement of member 156. Further, while for component efficiency, the elements which facilitate resilient, axial movement of member 156 have also been used to enable radial movement of member 156, separate elements equivalent to those described, if desired, could be used.

Continuing with reference to FIG. 4, the displacement means also includes an actuator for moving substrate engaging member 156 radially relative to probe base housing 174. As seen in FIG. 4, the actuator, in preferred form, includes two cams 270 and 272 mounted on substrate engaging member 156. Cams 270 and 272 are alike, and, as seen in FIGS. 3 and 4, are, generally, cylinder-like sections having cam contours 274 and 276. As best seen in FIG. 4, contours 274 and 276 have cross sections that extend radially outwardly, as measured from the center of support 160, in a generally increasing fashion from first points 277, 283, respectively, on wall 226 to apexes 279, 285 respectively, and in gradually decreasing fashion to second points 281, 287, respectively, on wall 226. Further, in preferred form, cams 270 and 272 are mounted on support 160 such that the line extending between cam apexes 279 and 285 is oriented substantially parallel to side walls 262, 264 of guide way slots 224; i.e., the X direction of probe array 153, as shown in FIG. 4. As will be appreciated, with this arrangement, displacement of substrate engaging member 156 arising from cams 270 and 272 is exclusively in the X direction of probe array 153. If displacement in both the X and Y directions of array 153 were desired, cams 270 and 272 would be mounted so that the line extending from apex 279 to 285 would be oriented at an angle to the guide way slot direction; i.e., side walls 262, 264 of slots 224; the angle depending on the displacement components in the X and Y directions desired. Continuing with reference to FIGS. 4 and 5, the length axis of cams 270 and 272 is substantially parallel to that of support 160 in preferred form.

The actuator further includes a cam follower which as shown in FIG. 4 is comprised of roller 278 mounted in a support 280 that is affixed to an annular wheel 282. As best seen in FIG. 5, roller 278 is cylindrical, having a cam engaging contour 284 at it periphery for engaging contours 274 and 276 of cams 270 and 272, respectively. Returning to FIG. 4, roller 278 is rotatably mounted on a pin 286 which is placed axially through the roller body such that the axis of roller 278 is oriented substantially parallel to the length axis of cams 270 and 272, and substrate engaging member 156.

Pin 286 is fixed between clevis arms 288 and 290 (FIG. 5) which extend from body 292 of roller support 280. Roller support 280 is, itself, mounted at upper surface 293 of annular wheel 282 such that clevis arms 288, 290, pin 286 and roller 278 extend radially inwardly toward cams 270, 272, as shown in FIG. 4. Support 280 is mounted on wheel 282 in any convenient manner; e.g., by bolts as shown. In preferred form, the radial position of support 280 is variable such that the proximity of roller 278 to wall 226 of support 160 is adjustable. As will be appreciated, this can be conveniently facilitated by arranging the mounting holes in support 292 through which the bolts pass as radially oriented slots. Wheel 282 is coaxially mounted relative to, and for rotation about contactor housing 42 and probe assembly 32.

The actuator also includes a drive motor 294 which is under the control of the apparatus testing means. Motor 294 is disposed at the outer periphery 296 of wheel 282 and has a pinion gear, not shown, for engaging a ring gear 298 at wheel periphery 296 for driving wheel 282, support 280 and roller 278 orbitally relative to cams 270 and 272.

With this arrangement, when roller 278 engages apex 279 of cam 270, a first displacement position is established in which substrate engaging member 156 is displaced to a maximum in the positive X direction. Further, when wheel 282 is, thereafter, rotated 180 degrees such that roller 278 engages apex 285 of cam 272, substrate engaging member 156 is displaced to a maximum in the negative X direction, and a second displacement position is established. As will be appreciated, reference to the "positive X" and "negative X" direction is based on a convention in which zero displacement is defined when member 156 is axially aligned with probe housing base 174.

Continuing with reference to FIG. 4, thus, by rotating wheel 282 through 180 degree increments, cam follower roller 278 alternately engages cam apexes 279 and 285, and, thereby, reciprocates substrate engaging member 156, apertures 162 and probe array 153 between a first and second substrate alignment position.

The distance of cam apex 279 and apex 285 from side wall 226 of support 160; i.e., the eccentricity of each cam, and the spacing of roller 278 from side wall 226 establishes the magnitude of displacement. Particularly, where the eccentricity of cam 270 and 272 is the same, and roller 279 is radially positioned abutting support side wall 226, the magnitude of the displacement in the positive X and negative X directions is equal to the cam eccentricity. Further, the distance between the first alignment position and the second alignment position is equal to twice the cam eccentricity. If roller 278 is radially spaced from wall 226, displacement in the positive X and negative X directions is reduced by that spacing, and becomes equal to the cam eccentricity, less the distance from roller 278 to wall 226. Accordingly, displacement goes to zero where the roller is spaced a distance from wall 226 equal to the cam eccentricity. As will be appreciated, displacement in the positive and negative X directions will be the same where the substrate metalization patterns require repeated movement between a first and second position for proper probe alignment. In such case, eccentricity of cams 270 and 272 will be the same. As will also be appreciated, inner periphery 300 of wheel 282 is radially spaced from wall 226 to avoid obstructing displacement of substrate engaging member 156.

While probe assembly 32 has been described in the second preferred embodiment of contactor 28 for use in association with repairable space transformed 36, it will be appreciated by those skilled in the art that probe assembly 32 could be used equally well with other types of space transformers.

As noted above, substrate test results can be uncertain, and efforts to remove that uncertainty costly and complex. Because so many things can go wrong in contacting a substrate, initial indications of fault are suspect, and require verification before they can be considered actual. Misalignment of probes with the substrate pattern; inadequate engagement of the metalization; broken or bent probes and severed fan-out segments may all give rise to indications of substrate open and short circuits which are false. Accordingly, steps are required to verify that a fault indication obtained during test is actually due to a substrate defect, and not some problem associated with the contractor.

In the past, substrate test methods included verification steps that required successive tests of the substrate at a primary test apparatus; i.e., apparatus 1, and, thereafter, at a secondary test apparatus, not shown. Following a first substrate test at the primary test apparatus, a second test was undertaken at the primary test apparatus in which the relative position of the substrate and probe assembly was adjusted. In the second test, the substrate metalization points were associated with probe elements different from those they were associated with in the first test. This adjustment of contact points and associated probe elements permitted identification of at least some of the spurious fault indications attributable to contacting problems. Where, based on the tests at the primary apparatus the substrate fault indications were considered likely to be valid, the substrate was removed to a secondary apparatus and tested yet again. The secondary test apparatus was equipped with probe assemblies having a few precisely locatable probe elements that could reliably retest the substrate circuits indicated as defective, and, thereby eliminate any question of whether the fault indication was caused by a contactor problem. If the secondary apparatus also showed the defect, the defect was considered confirmed, and steps taken to compensate it. By identifying at least some of the spurious fault indications at the primary test apparatus, and eliminating them, testing at the secondary apparatus, and, accordingly, overall test time and expense was reduced.

However, since the second test of the substrate at the primary test apparatus required rotation of the substrate about an axis of symmetry common to both the chip and I/O metalization patterns, it could not be carried out were one or the other or both patterns were asymmetrical. As a result all fault verification in substrates having asymmetrical metalization patterns was required be carried out at the secondary test apparatus. Where the number of defect indications at the primary apparatus is high, however, verification at the secondary test apparatus becomes excessively time consuming and expensive. Further, the time and expense is unjustified, from a product standpoint, where the defects arise from test equipment failures rather than substrate defects.

Considering the prior art test method in greater detail, it included steps at apparatus 1 for initially positioning substrate 4 and contactors 26, 28 so that contactor probe assemblies 30, 32 would align with metalization patterns 8, 12, and the associated substrate circuitry to be tested. To minimize equipment complexity, probe assemblies 30, 32 in the prior art were arranged to be stationary in the plane of substrate metalization patterns 8, 12, while substrate 4 was arranged to be movable. Since metalization patterns 8, 12 were of known configuration, probe assemblies 30, 32 could be located in preset positions and substrate 4 simply moved into place between them to establish the required alignment position at the time of test.

Thereafter, the probes of assemblies 30, 32 were electrically coupled to the substrate to establish a first set of test circuits. As noted, substrate 4 was simultaneously contacted at a points on chip and I/O metalization patterns 8, 12; i.e., at the chip upper and lower surfaces, respectively, by axially moving contactors 26, 28 into engagement with the substrate. When formed, these first test circuits, therefore, included both the substrate circuitry and the associated contactor circuitry required to couple the substrate to the testing means.

Next, the testing means applied electrical signals to the first test circuits, and monitored the results. The test signals and their sequence of application were selected based on the characteristics of the substrate. The test signals and their sequence are well known in the art, and, therefore, need not be discussed here. Based on the application and analysis of the test signals, the testing means identified first test circuits containing electrical faults; e.g., opens and shorts. The testing means further stored the identities of the first test circuits containing faults, along with the identities of the substrate circuit and associated contactor circuit which constituted the first test circuit. The testing means made the required associations between test, substrate and contactor circuits based on position information for the substrate and contactors stored in the testing means.

Subsequently, the relative position of substrate 4 and the probes of assemblies 30, 32 were adjusted. Particularly, the relative position was adjusted so that the probes would align with different points of metalization patterns 8, 12 in the new position. Since probe assemblies 30, 32 were arranged to be stationary in the plane of metalization patterns 8, 12, relative position of assemblies 30, 32 and substrate 4 could only be adjusted by movement of substrate 4. Further, since probe assembly 30, 32 were preset to align with the entirety of their respective metalization patterns 8, 12, adjustment of relative position so that the probes aligned with new points in the metalization patterns required substrate 4 be rotated in the plan of the patterns 8, 12, about an axis of symmetry common to both patterns, by an amount other than a multiple of 360 degrees. In preferred form, substrate 4 was rotated about its height; i.e., thickness axis, by 180 degrees.

With substrate 4 and the probes of assemblies 30, 32, realigned, the probes were again electrically coupled to the substrate to form a set of second test circuits. In the second test circuits, the substrate circuits were associated with contactor circuits that were different from those they were associated with in the first test circuits. As before, contactors 26, 28 were moved axially toward substrate 4, so that the probes of assemblies 30, 32, physically engaged substrate metalization patterns 8, 12 substantially simultaneously.

Following the establishment of the second test circuits, the testing means again applied a sequence of test signals determined by substrate characteristics to the substrate, and monitored the results to identify second test circuits having electrical faults; e.g., opens and shorts. And, as in the case of the first test circuits, the testing means stored the identity of the second test circuits indicated as defective along with the identify of the associated substrate and contactor circuits. As before, information stored in the testing means enabled correlation of test, substrate and contactor circuits in the second test position.

Finally, the testing means compared the stored identity information concerning the first and second test circuits indicated as containing faults and their constituent substrate and contactor circuits.

In testing for open circuits, if the testing means found a substrate circuit was associated with both a faulty first test circuit and a faulty second test circuit, and the companion contactor circuits were not found associated with both a faulty first and second test circuit, the testing means concluded the substrate fault indication was likely to be valid, and the substrate circuit defective. In that case, the noted substrate circuit was catalogued, and the substrate subsequently sent to the secondary test apparatus, for further defect verification, and, if necessary, defect compensation in accordance with techniques well known in the MLC manufacturing art.

On the other hand, if in testing for open circuits the testing means found a substrate circuit was not associated with both a first and a second test circuit indicated as including a defect, the testing means assumed the substrate fault indication was spurious, and that the substrate was not defective. In that case, the substrate fault indication was disregarded, and further verification eliminated.

As will be appreciated, in testing for opens circuits, where a substrate circuit was found associated with both a faulty first and second test circuit, and the companion contactor circuit was also found associated with a faulty first and second test circuit, no conclusion about the validity of the fault indication could be drawn, and the substrate circuit was required to be sent to the secondary test apparatus for further verification, and compensation, if necessary.

In the case of short circuit testing, since it is uncommon for contactor circuits to short circuit, if a substrate circuit was found associated with either a first or a second faulty test circuit, it was assumed the fault indication was valid; the absence a short indication in both tests being attributable to the substrate circuit being paired with an open contactor circuit in the test where it did not show a short fault. In that case, the substrate was sent to the secondary test apparatus for further verification and compensation.

Again in the case of short circuit test, as will be appreciated, if the substrate circuit was associated with a fault in both the first and the second test circuit, the fault indications were considered likely to be valid and the substrate circuit defective. As before, the substrate circuit was sent to the second apparatus for further verification and compensation.

While the prior art method is successful in reducing verification time and expense for substrates having symmetrical metalization patterns, it is not suitable for use with substrates having asymmetrical patterns. As noted, the prior art method requires the relative position of substrate 4 and the probes be adjusted by rotating the substrate in the plane of metalization patterns 8, 12, about an axis of symmetry common to both patterns. Where there is no common axis of symmetry, however, rotation can not be undertaken without creating probe misalignment, and the prior art method can not be used. Accordingly, all fault verification must be conducted at the secondary test apparatus with the associated risk of unnecessary time and expense.

In accordance with this invention, the prior art test method is improved so that the test results of both substrates having symmetrical and asymmetrical metalization patterns can be verified at the primary test apparatus. Particularly, the prior art test method is improved by including steps for adjusting the relative position of the substrate and probes by rotating the substrate about an axis of symmetry associated with one of the substrate metalization patterns, and, thereafter, moving the probes associated with the other substrate metalization pattern from a first substrate alignment position to a second substrate alignment position.

In preferred form, since there is a much larger number of points to be contacted at chip metalization pattern 8 than I/O pattern 12, it is preferable to rotate substrate 4 about an a axis of symmetry associated with pattern 8 to minimize the number of probes that will require realignment. Additionally, a force is applied to probes 152 of I/O contactor 28, substantially parallel to the cross section of probes, to move them in a prescribed direction from a first position in which they align with the points in metalization pattern 12 to be contacted before substrate rotation, to a second position in which they align with points of metalization pattern 12 to be contacted following substrate rotation.

Particularly, in preferred form, and in accordance with the described operation of the displacement means noted above, where the substrate metalization patterns 8, 12 do not have a common axis of symmetry, following rotation of substrate 4 about an axis of symmetry associated with pattern 8, probes 152 received in apertures 162 of plate 158 are urged laterally, as plate 158 is moved in accordance with guide ways 224 and pins 244 under the action of cam follower 278 at cam 270, from a first probe alignment position to a second probe alignment position. In accordance with the invention, the first alignment position is established such that probes 152 align with points in metalization pattern 12 to be contacted to form the first test circuits, and the second alignment position is established such that probes 152 align with points in metalization pattern 12 to be contacted to form the second test circuits following substrate rotation.

As will be appreciated, where the substrate metalization patterns 8, 12 have a common axis of symmetry, following rotation of the substrate, no realignment of probes 152 is required, the first alignment position being appropriate for both the first test circuits and the second test circuits.

While this invention has been shown and described with reference to preferred embodiments thereof, it will be understood by those skilled in the art that changes in form and detail may be made to the embodiments described without departing from the spirit and scope of the invention.

What is claimed is:

1. A probe assembly for use in a contactor, which contactor is capable of coupling an electrical testing means to a substrate containing electrical circuitry, the probe assembly comprising:
   (a) a plurality of electrically conductive, individually plug replaceable, buckling beam probes confined in a spatially limited probe pattern for engaging said circuitry on said substrate,
   (b) said buckling beam type probes being adapted so that when said probes engage said substrate, said probes begin to buckle once a predetermined engaging force is exceeded; and
   (c) a plurality of individual probe sockets, each of said probe sockets being adapted for releasably retaining an individual probe inserted in said socket; and
   (d) radial displacement means for radially displacing said probe pattern.

2. A probe assembly for use in a contactor, which contactor is capable of coupling an electrical testing means to a substrate containing electrical circuitry, the probe assembly comprising:
   (a) a plurality of electrically conductive individually plug replaceable, buckling beam probes confined in a spatially limited probe pattern for engaging said circuitry on said substrate,
   (b) said buckling beam type probes being adapted so that when said probes engage said substrate, said probes begin to buckle once a predetermined engaging force is exceeded;
   (c) a plurality of individual probe sockets, each of said probe sockets being adapted for releasably retaining an individual probe inserted in said socket
   (d) said individually plug replaceable probes and said probe sockets are axially mounted in a probe housing, such that said probes received in a said socket have a first end oriented to engage said circuitry and a second end of each of said probes being releasably engaged in a sleeve in one of said probe sockets.

3. The probe assembly of claim 2 wherein said probe housing includes a movably mounted substrate engaging member,
   (e) said substrate engaging member having a plurality of probe apertures arranged in an aperture pattern corresponding to said spatially limited probe pattern in which said first ends of said individually plug replaceable probes are received, and
   (f) said probe apertures defining said spatially limited probe pattern, wherein said sockets are fixedly mounted in said probe housing for electrical connection of said sockets to said testing means.

4. The probe assembly of claim 3 wherein
   (g) said probe assembly includes radial displacement means which is arranged to shift said probe apertures radially relative to the cross sections of said probes such that the spatial pattern of said probes is displaceable radially.

5. The probe assembly of claim 4 wherein (h) said radial displacement means includes guide means having one or more guide pins mounted in said probe housing, which guide pins cooperate with companion guide ways having prescribed contours,
   (i) said guide ways being provided in said substrate engaging member,
   (j) said radial displacement means further including an actuator for moving said substrate engaging member relative to said guide pins in accordance with the contours of said guide ways.

6. The probe assembly of claim 5 wherein said actuator includes
   (k) a plurality of cams fixedly mounted to said probe housing,
   (l) a cam follower movably mounted relative to said cams such that said cam follower engages said cams, and
   (m) means for driving said cam follower relative to said cams.

7. The probe assembly of claim 5 wherein
   (n) said guide ways are slots and said actuator includes two of said cams mounted on said probe housing displaced approximately 180 degrees from one another, and
   (o) said cam follower being mounted for orbital movement relative to said two cams, such that as said cam follower alternately engages said two cams, said substrate engaging member reciprocates between a first position and a second position.

8. The probe assembly of claim 5 wherein
   (p) said substrate engaging member is movable relative to the length of said individually plug replaceable probes so that (1) in a first position said substrate engaging member shrouds the first ends of said probes, and
(2) in a second position said substrate engaging member exposes the first ends of said probes so that said probes may engage said circuitry.

9. The probe assembly of claim 5 further including beam buckling control means for controlling said engaging force at which said individually plug replaceable probes begin to buckle.

10. The probe assembly of claim 9 wherein said beam buckling control means includes a control member mounted in said housing at a point between said sockets and said apertures,
such that the distance from said probe apertures in said substrate engaging member to said control member establishes the engaging force at which said probes begin to buckle.

11. A probe assembly for use in a contactor which contactor is capable of coupling an electrical testing means to a substrate containing electrical circuitry, said probe assembly comprising:
a probe housing having a substrate engaging member and a housing base, said substrate engaging member including a plurality of apertures arranged in a spatially limited aperture pattern corresponding to a pattern in said circuitry;
a plurality of electrically conductive, individually plug replaceable, probes of the buckling beam type, each of said probes having a first end and a second end, each of said probes being axially mounted in said housing with said first end of each of said probes being received in a said aperture in said substrate engaging member of said housing;
a plurality of probe sockets axially mounted in said probe housing base, each socket fixedly mounted in said housing base for releasably engaging said second end of a said probe;
displacement means for moving said substrate engaging means radially relative to said housing base, so that the probe pattern as defined by said aperture pattern is displaceable radially,
said displacement means including actuator means for shifting said substrate engaging member, and
guide means secured to said housing, said guide means being adapted for constraining the movement of said substrate engaging member.

* * * * *